(12) United States Patent
Schuhl et al.

(10) Patent No.: US 9,557,392 B2
(45) Date of Patent: Jan. 31, 2017

(54) INTEGRATED MAGNETOMETER AND ITS MANUFACTURING PROCESS

(75) Inventors: Alain Schuhl, Grenoble (FR); Gilles Gaudin, Le Sappey (FR); Philippe Sabon, Moirans (FR); Pierre-Jean Zermatten, Grenoble (FR); François Montaigne, Nancy (FR)

(73) Assignees: Centre National de la Recherche Scientifique, Paris (FR); Commissariat a l'Energie Atomique et aux Energies Alternatives, Paris (FR)

( * ) Notice: Subject to any disclaimer, the term of this patent is extended or adjusted under 35 U.S.C. 154(b) by 388 days.

(21) Appl. No.: 13/575,221

(22) PCT Filed: Jan. 28, 2011

(86) PCT No.: PCT/FR2011/000058
§ 371 (c)(1),
(2), (4) Date: Oct. 17, 2012

(87) PCT Pub. No.: WO2011/092406
PCT Pub. Date: Aug. 4, 2011

(65) Prior Publication Data
US 2013/0134970 A1 May 30, 2013

(30) Foreign Application Priority Data

Jan. 29, 2010 (FR) .................................. 10 00369

(51) Int. Cl.
*G01R 33/09* (2006.01)
*G01R 33/02* (2006.01)
*G01R 33/00* (2006.01)

(52) U.S. Cl.
CPC ......... *G01R 33/093* (2013.01); *G01R 33/0005* (2013.01); *G01R 33/0029* (2013.01); *G01R 33/02* (2013.01); *G01R 33/0206* (2013.01); *G01R 33/098* (2013.01)

(58) Field of Classification Search
CPC .............................. G01R 33/093; G01R 33/02
USPC .......................................................... 324/252
See application file for complete search history.

(56) References Cited

U.S. PATENT DOCUMENTS

| | | | | |
|---|---|---|---|---|
| 6,028,749 A | * | 2/2000 | Postma | .................... 360/327.31 |
| 2003/0141957 A1 | * | 7/2003 | Bohlinger | ................... 338/32 R |
| 2008/0169807 A1 | | 7/2008 | Naito et al. | |
| 2009/0027048 A1 | | 1/2009 | Sato et al. | |
| 2009/0237074 A1 | * | 9/2009 | Kou | ....................... B82Y 25/00 324/247 |

* cited by examiner

*Primary Examiner* — Reena Aurora
(74) *Attorney, Agent, or Firm* — Morgan, Lewis & Bockius LLP

(57) ABSTRACT

Integrated magnetometer comprising a plurality of multilayer magnetoresistive sensors deposited on a surface, called the top surface, of a substantially planar substrate, characterized in that said top surface of the substrate has at least one cavity or protuberance provided with a plurality of inclined faces, and in that at least four said magnetoresistive sensors are placed on four said magnetoresistive sensors are placed on four said inclined faces, having different orientations and opposite one another in pairs, each sensor being sensitive to one component of an external magnetic field parallel to that face on which it is placed. Process for manufacturing such a magnetometer.

14 Claims, 5 Drawing Sheets

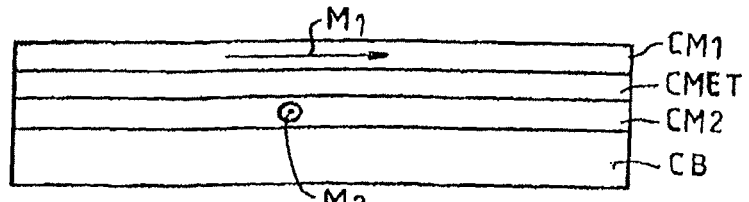
FIG.1A Prior Art
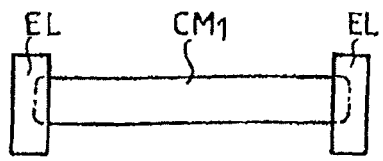
FIG.1B Prior Art
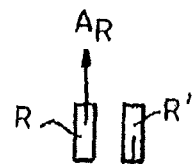
FIG.3B Prior Art
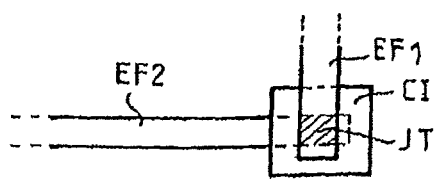
FIG.2 Prior Art
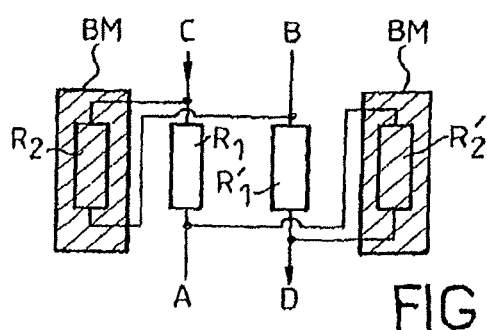
FIG.3A Prior Art
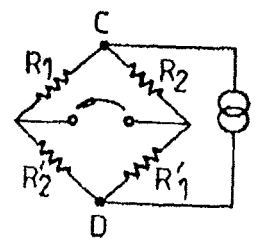

INTEGRATED MAGNETOMETER AND ITS MANUFACTURING PROCESS

RELATED APPLICATIONS

The present application is a U.S. National Phase Application of International Application No. PCT/FR2011/000058 (filed Jan. 28, 2011) which claims priority to French Application No. 1000369 (filed Jan. 29, 2010) which are hereby incorporated by reference in their entirety The invention relates to an integrated magnetometer having two or three axes, and also to a method of fabricating it.

In the prior art, it is known to make integrated magnetometers that are based on multilayer magnetoresistive sensors, making use of the giant magnetoresistance effect or of the tunnel magnetoresistance effect. For example, reference may be made to the following articles:

- M. Hehn, F. Montaigne and A. Schuhl "Magnétorésistance géante et électronique de spin", [Giant magnetoresistance and spin electronics], Techniques de l'Ingenieur, E 2 135, Chapters 1 and 2;
- J. Daughton et al. "Magnetic Field Sensors Using GMR Multilayer", IEEE Transactions on magnetics, Vol. 30, No. 6, November 1994; and
- M. Tondra et al. "Picotesla field sensor design using spin-dependent tunneling devices", Journal of Applied Physics, Vol. 83, No. 11, pp. 6688-6690, Jun. 1, 1998.

Such magnetoresistive sensors are made up of a stack of thin layers that are deposited on a planar substrate, e.g. made of silicon.

More precisely, and as shown in FIG. 1A, a giant magnetoresistance (GMR) magnetoresistive sensor is made up of two magnetic layers CM1 and CM2, e.g. made of cobalt, spaced apart by a metallic layer CMET, e.g. made of copper, and of thickness that is of nanometer order. The bottom layer CM2 is said to be "hard" since its magnetization (magnetic moment) $M_2$ is made insensitive to any external magnetic field (providing it is not too intense), while the top layer CM1 is said to be "soft" since its magnetic moment $M_1$ can be modified by an external magnetic field of moderate intensity. The magnetization of the "hard" layer is obtained by depositing it on an antiferromagnetic layer referred to as a blocking layer CB. The magnetization of the "soft" layer is obtained by annealing to above the Curie point, followed by cooling in the presence of a magnetic field having an appropriate direction.

The electrical resistance of that structure, as measured parallel to the layers CM1 and CM2, depends on the cosine of the angle $\theta$ between $M_1$ and $M_2$. In order to obtain a linear response, $M_1$ and $M_2$ are generally chosen to be mutually perpendicular in the absence of an external magnetic field.

When an external magnetic B is applied to the structure of FIG. 1, the magnetic moment $M_1$ of the "soft" layer turns, and the angle $\theta$ changes. To the first order, only the component of the field B that is perpendicular to $M_1$ and that is situated in the plane of the layers acts on the orientation of the sensor. In other words, when the two magnetizations $M_1$ and $M_2$ are perpendicular in the absence of a magnetic field, the sensor is sensitive only to the component of the field that is oriented in the magnetization direction $M_2$ of its "hard" layer.

In a GMR sensor, electric current flows parallel to the planes of the layers. Consequently, such a sensor is in the form of a narrow and elongate strip, with electrodes EL at its ends (FIG. 1B).

A second type of sensor, the tunnel magnetoresistance (TMR) sensor is also made up of two layers EF1 and EF2 of a conductive ferromagnetic material, e.g. Co, Fe, or CoFe, which material may be identical or different in the "electrodes" that are spaced apart by a fine layer CI of an insulator such as alumina ($Al_2O_3$) or magnesium oxide (MgO), and typically presenting thickness lying in the range 0.8 nanometers (nm) to 5 nm. As with GMR sensors, the magnetization of the bottom electrode EF2 is constant, whereas that of the top electrode may be modified by an external magnetic field. The probability of an electron crossing the insulation barrier by the tunnel effect, and thus the resistance of the tunnel junction JT, depends on the cosine of the angle $\theta$ between the magnetizations of the two magnetic layers. Like a GMR sensor, when the magnetizations of the layers EF1 and EF2 are perpendicular in the absence of a magnetic field, a TMR sensor is sensitive only to the field component oriented along the magnetization direction of its "hard" electrode.

In a TMR sensor, electric current flows perpendicularly to the planes of the layers. Consequently, such a sensor is in the form of two crossed strips, constituted by the ferromagnetic electrodes EF1 and EF2, spaced apart by the layer CI, as shown in FIG. 2.

In magnetoresistive sensors, regardless of whether they are of the GMR type or of the TMR type, there arises the problem of eliminating the offset, i.e. the resistance component that is independent of the magnetic field. This offset is large and depends on temperature.

A first possibility for eliminating this offset, shown in FIG. 3A, consists in combining on a common substrate four identical sensors $R_1$, $R_1'$, $R_2$, $R_2'$ having mutually parallel sensitivity axes. These four sensors are connected so as to form a Wheatstone bridge, with a first arm formed by the sensors $R_1$ and $R_2$ and a second arm formed by the sensors $R_1'$ and $R_2'$. The sensors $R_2$ and $R_2'$ belonging to two different arms and occupying opposite positions in the Wheatstone bridge (i.e. not being directly connected to each other), are covered by magnetic shielding BM of soft ferromagnetic alloy. As a result, only the resistances of $R_1$ and $R_1'$ depend on the external magnetic field. If the points C and D of the bridge are connected to a current source, the potential difference between the points A and B is proportional to $\cos(\theta)$, and thus to the component of the external magnetic field that can be measured. It is not essential for all four sensors to be identical: it suffices for the resistances of $R_1$ and $R_1'$ to be equal to each other, and likewise for $R_2$ and $R_2'$, and for the offsets of all four sensors to present the same temperature dependency.

As shown in FIG. 3B, a second solution for eliminating offsets consists in performing a differential measurement of resistance between two identical sensors R and R' that present responses of opposite signs to a given magnetic field component (arrows $A_R$, $A_{R'}$). Two sensors of this type may present "hard" layers with opposite magnetizations. This may be achieved in various ways, and in particular:

- by incorporating on the substrate an array of electric lines that make it possible to apply magnetic fields locally in different directions; or
- by depositing one of the sensors on a special multilayer structure known as an artificial antiferromagnet (AAF), which is in turn deposited on the blocking layer. The AAF structure is constituted by two magnetic layers separated by a metal spacer that induces antiferromagnetic coupling between them. Because of this coupling, the magnetizations of the two layers remain constantly in an antiparallel alignment: thus, the "hard" layer of the sensor is polarized in a direction opposite to the magnetic moment of the blocking layer.

FIG. 4 is a section view of a sensor including an AAF. It is difficult to use an AAF structure in a GMR sensor because the structure increases the conductivity of the sensor and therefore decreases its sensitivity. This problem does not arise with a TMR sensor.

The prior art does not make it possible to make an integrated magnetometer having three axes: at best, the magnetoresistive sensors deposited on a planar substrate are capable of measuring the two components of the projection of an external magnetic field onto the plane of the substrate. In the prior art, a three-axis magnetometer is generally made in hybrid form, using at least two substrates that are not coplanar. This results in devices that are expensive to make, bulky, and delicate, and above all that present accuracy that is limited by systematic errors associated with assembling the magnetometer.

Making a magnetometer with one or two axes is possible, but as explained above, requires relatively complex techniques to be implemented in order to eliminate the offset.

Documents US 2009/027048 and US 2008/169807 describe integrated three-axis magnetometers having magnetoresistive sensors deposited on the plane surface of a substrate in two different orientations, together with other sensors deposited on inclined faces that are obtained by etching grooves in said surface. The sensors deposited on the plane surface serve to measure the magnetic field in two dimensions; while the sensors that are deposited on the inclined faces of the grooves give access to the third dimension. The problem of eliminating offset remains in full, as does offset drift.

The invention seeks to overcome the above-mentioned drawbacks of the prior art.

One aspect of the invention that enables this object to be achieved is an integrated magnetometer comprising a plurality of multilayer magnetoresistive sensors deposited on a "top" surface of a substantially planar substrate, the magnetometer being characterized in that:
  said top surface of the substrate presents at least one cavity or projection having a plurality of inclined faces; and in that
  at least four of said magnetoresistive sensors are deposited on four of said inclined faces, presenting orientations that are different and opposite in pairs, each sensor being sensitive to an external magnetic field component that is parallel to the face on which it is deposited.

Advantageous embodiments of the magnetometer of the invention constitute the subject matter of dependent claims.

Another aspect of the invention is a method of fabricating a magnetometer as described above, the method comprising:
  a first step of making said or each cavity or projection in or on said top surface of said substrate;
  a second step of making said multilayer magnetoresistive sensors by successive deposition and lithographic operations; and
  a third step of annealing with an external magnetic field being applied in order to determine the sensitivity axes of the sensors made in this way.

In particular implementations of the method:
  said first step may be implemented by anisotropic etching of said substrate, which substrate must then be monocrystalline;
  said second step may include at least one operation of depositing a uniform layer of resin on the surface of said substrate, the or each deposition operation being performed by spray-coating or vaporizing said resin.

Other characteristics, details, and advantages of the invention will appear on reading the following description made with reference to the accompanying drawings given by way of example and in which:

FIGS. 1A, 1B, 2, 3A, 3B, and 4, described above, show integrated magnetoresistive sensors known in the prior art;

Figure 4:
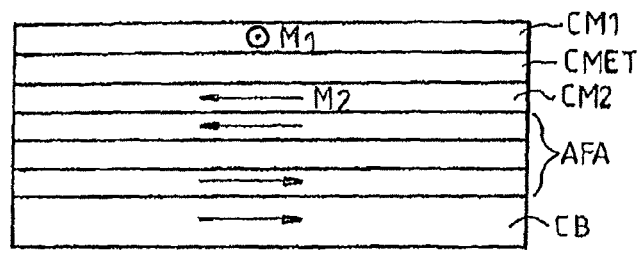
Figure 5A:
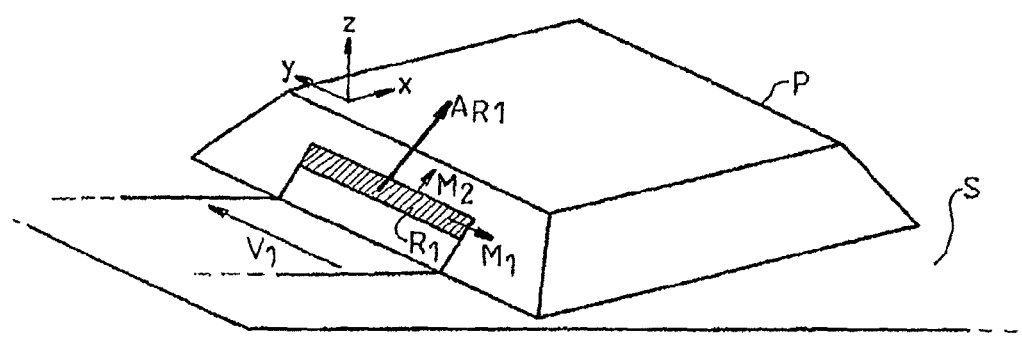
FIGS. 5A and 5B are respectively an elevation view and a section view of a projection in the form of a truncated pyramid obtained by anisotropic etching of a monocrystalline silicon substrate, with a GMR type magnetoresistive sensor deposited on a face of the truncated pyramid.
Figure 5B:
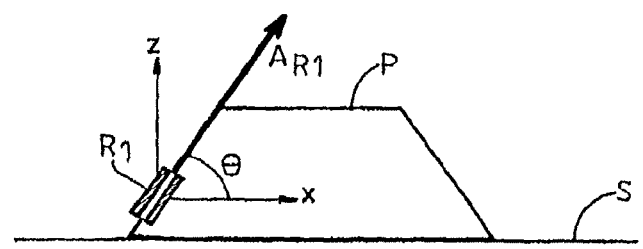

FIGS. 5A and 5B relate to a single GMR type magnetoresistive sensor $R_1$ deposited on a face of a projection P in the form of a truncated pyramid, made by anisotropic etching of a monocrystalline silicon substrate S of surface corresponding to the crystal plane 100. Under such conditions, the four faces of the pyramid correspond to planes 111 and they are inclined at an angle $\theta=54.7°$ relative to the surface of the substrate. Making protuberances of this type—and also cavities that are likewise of truncated pyramid shape—is described in the article by Chii-Rong Yang et al. "Study on anisotropic silicon etching characteristics in various surfactant-added tetramethyl ammonium hydroxide water solutions", J. Micromech. Micoreng. 15, 2028 (2005).

In the figure, $M_1$ represents the magnetic moment of the (soft) sensitive layer of $R_1$, $M_2$ represents the magnetic moment of the hard layer, and $A_{R1}$ represents the detection axis of the sensor, which is parallel to $M_2$. The surface of the substrate S is parallel to the xy plane and perpendicular to the z axis. $B_x$, $B_y$, and $B_z$ are the components along the axes x, y, and z, respectively of an external magnetic field to be measured.

A known current flows through the sensor $R_1$ in a direction parallel to the y axis; the voltage $V_1$ measured across its terminals serves to determine its resistance, which is a function of $B_x$ and $B_z$ but not of $B_y$. Within the linear response limit of the sensor, its output signal is given by:

$$V_1 = V_0 + S[B_z \sin\theta + B_x \cos\theta]$$

where S is the sensitivity of the sensor and $V_0$ is its offset, i.e. its output voltage in the absence of a magnetic field.

Because of its offset, the device of FIG. 5 is of limited interest since it is difficult to associate a voltage measurement with the value of a component of the magnetic field.

Figure 6:
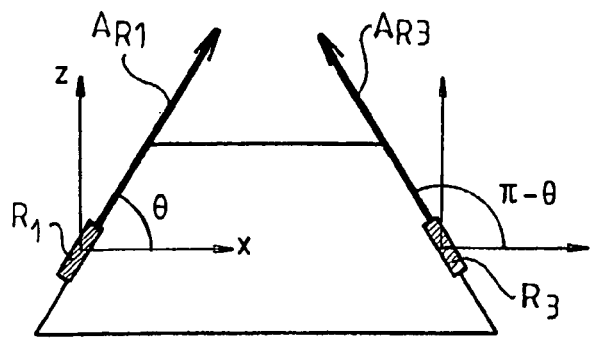
FIG. 6 is a section view of a single-axis magnetometer based on GMR type sensors.

FIG. 6 shows a device in which two identical sensors $R_1$ and $R_3$ are deposited on two opposite faces of the pyramid P. The output signals $V_1$ and $V_2$ enable $B_x$ to be determined, making it possible to eliminate the offset $V_0$:

$$B_x = \frac{1}{2\cos\theta} \frac{V_1 - V_3}{S}$$

In contrast, the measurement of the component $B_z$ depends on the offset:

$$B_z = \frac{1}{2\cos\theta} \frac{V_1 + V_3 - 2V_0}{S}$$

In order to eliminate the offset that affects the measurement of the component $B_z$, it is possible to replace the sensors $R_1$ and $R_3$ by two sets of four sensors mounted in a Wheatstone bridge of the type shown in above-described FIG. 3. In a variant, it is possible to replace the sensors by pairs of sensors having sensitivity axes that are parallel and sensitivities S that are opposite, as explained above.

Figure 7:
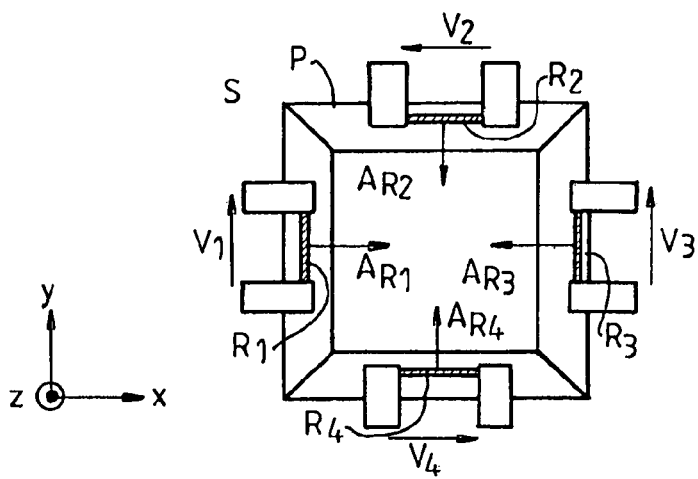
FIG. 7 is a plan view of a two-axis magnetometer in an embodiment of the invention, likewise based on GMR type sensors.

FIG. 7 shows a device in an embodiment of the invention, in which four identical sensors $R_1$, $R_2$, $R_3$, and $R_4$ are deposited on the four faces of the pyramid P, with their sensitivity axes $A_{R1}$, $A_{R2}$, $A_{R3}$, and $A_{R4}$ pointing towards the tip of the pyramid. This magnetometer enables $B_x$ and $B_y$ to be determined, thus providing a "compass":

$$B_x = \frac{1}{2\cos\theta} \frac{V_1 - V_3}{S}$$

$$B_y = \frac{1}{2\cos\theta} \frac{V_2 - V_4}{S}$$

If it is only the orientation of the magnetic field in the xy plane that is looked for, then knowledge of the sensitivity S is not required.

As with FIG. 6, in order to measure $B_z$ it is necessary to replace the sensors $R_1$, $R_2$, $R_3$, and $R_4$ by Wheatstone bridge circuits of the type shown in FIG. 3 or by pairs of sensors having sensitivity axes that are parallel and sensitivities S that are opposite.

Figure 8:
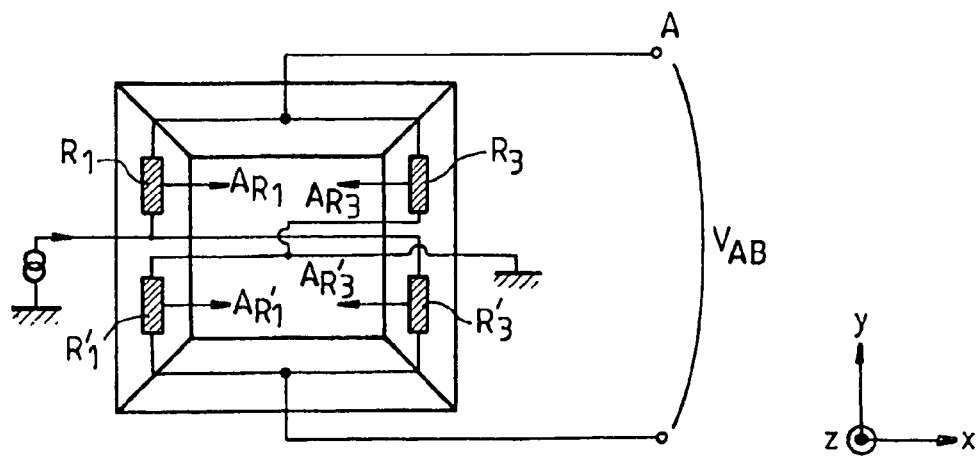
FIG. 8 is a plan view of a three-axis magnetometer in another embodiment of the invention, likewise based on GMR type sensors.

FIG. 8 shows a device in another embodiment of the invention that differs from the first embodiment in that the sensors deposited on the two faces of opposite orientations are duplicated so as to form pairs of identical individual sensors: $R_1$, $R_1'$ and $R_3$, $R_3'$. The four individual sensors are connected in a Wheatstone bridge as shown in the figure. The voltage $V_{AB}$ is directly proportional to $B_x$, thereby simplifying the electronics for processing measurements and enabling the dynamic range to be increased since there is no longer any need to amplify and possibly to convert into digital format the component $V_0$ of the measured voltage signals.

A bridge structure may also be implemented on the other two faces of the projection P, giving access to a signal that is indicative of the component $B_y$ of the magnetic field.

Figure 9:
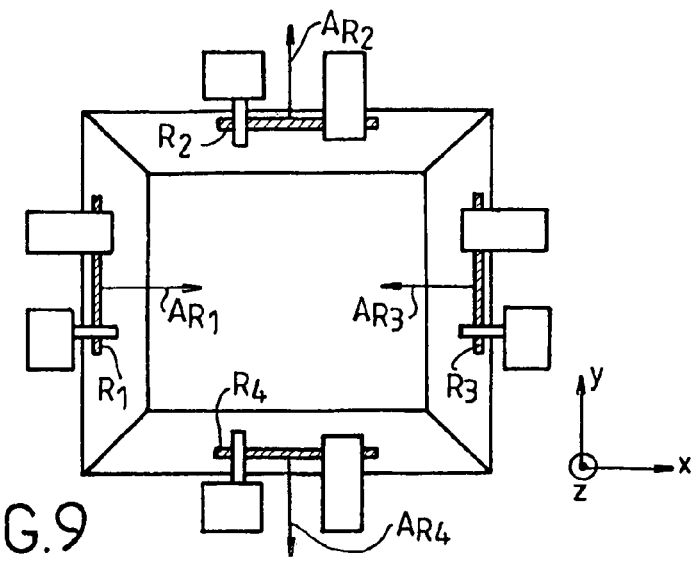
FIG. 9 is a plan view of a three-axis magnetometer in yet another embodiment of the invention, based on TMR type sensors.

FIG. 9 shows a device in yet another embodiment of the invention, which differs from the device of FIG. 7 only in that the sensors $R_2$ and $R_4$ include respective AAF structures that reverse their sensitivities (the arrows $A_{R2}$ and $A_{R4}$ point away from the tip of the pyramid P). The three components of the magnetic field are given by:

$$B_x = \frac{1}{2\cos\theta} \frac{V_1 - V_3}{S}$$

$$B_y = \frac{1}{2\cos\theta} \frac{V_2 - V_4}{S}$$

$$B_z = \frac{1}{4\sin\theta} \frac{V_1 + V_3 - (V_2 + V_4)}{S}$$

This means that the offset $V_0$ is completely eliminated.

In order to make a magnetometer of the type shown in FIG. 9, it suffices to mask the zones that are to have the sensors $R_1$ and $R_3$ deposited thereon while depositing the AAF structure. As explained above, this solution is more appropriate for TMR sensors (shown in FIG. 9) than for GMR sensors. As explained above, there is also an alternative to using an AAF structure: for this purpose it suffices to make an array of electric lines on the substrate to enable magnetic fields to be applied locally in different directions.

Figure 12:
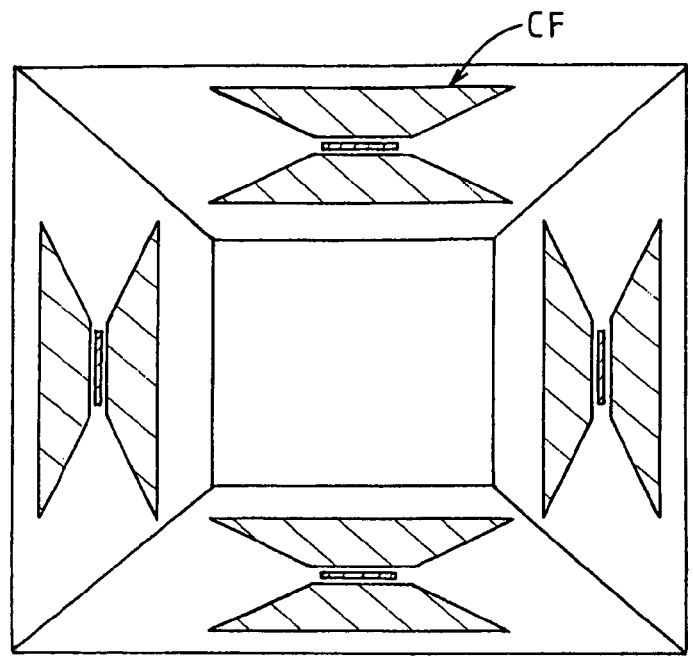
FIG. 12 is a plan view of a magnetometer in a variant of the invention that includes flux concentrators.

In order to increase the sensitivity of the magnetometer of the invention, it is possible to provide flux concentrators CF on the sloping faces that carry the magnetoresistive sensors. Each flux concentrator is constituted by two planar parts of high-permeability soft magnetic material (e.g. of permalloy), presenting a trapezoidal shape and facing each other via their short bases, with their height being parallel to the sensitivity axis of the magnetoresistive sensor (and thus pointing towards the base of the pyramid). These two parts concentrate the flux lines of the magnetic field in the region between their small bases, which is where the sensor is located. This variant is shown in FIG. 12.

Figure 13A:
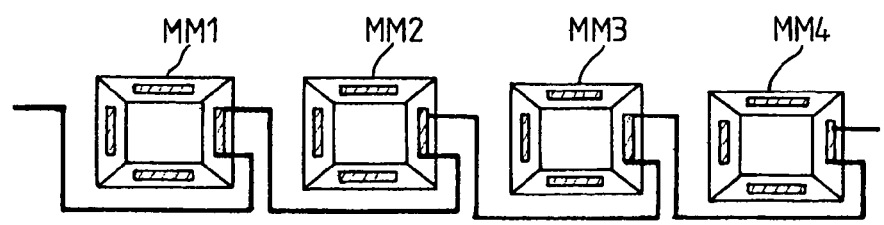
FIGS. 13A and 13B are plan views of respective magnetometers made up by connecting a plurality of magnetometers of the type shown in FIG. 7 together in series.
Figure 13B:
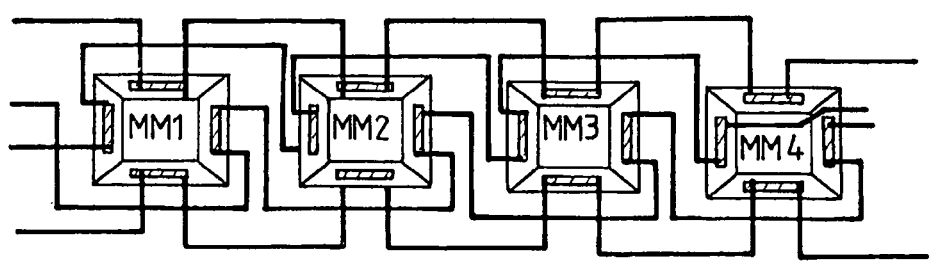

FIGS. 13A and 13B show a "complex" magnetometer made up of a plurality (specifically four) of individual magnetometers MM1-MM4 as described above, in which the corresponding sensors—i.e. having mutually parallel sensitivity axes—are connected together in series. This makes it possible to increase the signal-to-noise ratio; when TMR sensors are used, this also reduces the risk of the tunnel junctions breaking down. The individual magnetometers must be arranged in the immediate proximity of one another (a few millimeters or less, preferably 1 millimeter or less) in order to be subjected to the same magnetic field. In order to make it more readable, FIG. 13A shows a simplified configuration in which only one sensor of each individual magnetometer is connected in series with the corresponding sensors of the other magnetometers; FIG. 13B shows the configuration in which the four branches of each individual magnetometer contribute to a series connection. Naturally, the number of individual magnetometers could be other than four; the individual magnetometers need not necessarily be in alignment; by way of example, they could be arranged in a matrix.

The invention is described above with reference to embodiments based on using sensors that are mutually identical (ignoring sensitivities S of opposite signs, if any). This is not an essential limitation, and magnetometers made up of a plurality of different magnetoresistive sensors are not excluded from the ambit of the invention. Nevertheless, it is preferable to use sensors that are identical, since that makes it possible to minimize systematic errors. It is advantageous for the various sensors to be monolithically integrated together, thereby specifically making it possible to ensure that their characteristics are substantially identical. For the same purpose, it is preferable for the sensors to be placed in the immediate proximity of one another; typically, all of the sensors of a given magnetometer of the invention should be within a radius of 1 millimeter or less, and preferably of 100 micrometers or less, and more preferably of 50 micrometers or less.

The invention is described above with reference to embodiments based on the use of cavities or projections that are pyramid-shaped. Nevertheless, that is not an essential limitation; it is important that at least four magnetoresistive sensors are deposited, or more generally are arranged, on four inclined faces that present mutually different orientations and that are opposite in pairs. A pyramid, optionally truncated, presents four faces that satisfy this condition. In a variant, it is possible to have recourse to two V-shaped grooves that are not parallel (and that are preferably perpendicular), e.g. forming a chevron.

Figure 10:
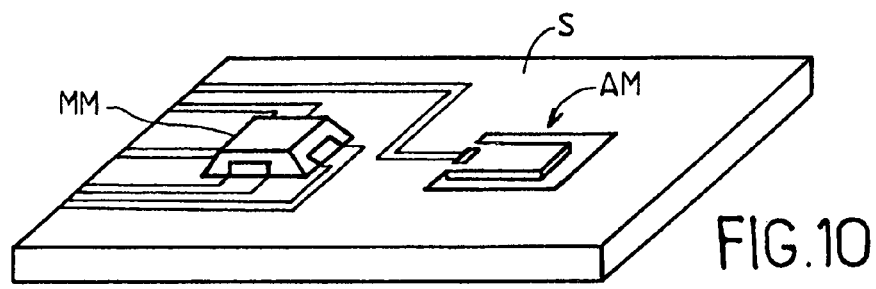
FIG. 10 is an elevation view of a magnetometer of the invention integrated together with an accelerometer.

FIG. 10 is an elevation view of a magnetometer MM of the type shown in FIG. 9, co-integrated with a microelectromechanical accelerometer AM with a cantilever beam that is sensitive along the z axis. When the device is at rest, the accelerometer measures the acceleration component due to gravity g along the z axis, thus making it possible to determine the angle of inclination of said axis relative to the vertical. This makes it possible to determine the components of the magnetic field B that are parallel and perpendicular to local vertical. Naturally, accelerometers of different types having one or three axes could be used.

The magnetometer of the invention is generally connected to an electronic processor circuit, by means of conductor lines deposited on the substrate S using techniques that are conventional in microelectronics. This circuit, which may be of digital, analog, or hybrid digital/analog type, serves to perform resistance measurements and to process the results of those measurements in order to determine the looked-for components of the magnetic field. Advantageously, the circuit may be integrated on the substrate S.

FIGS. 11A-11D are highly diagrammatic views showing the different steps of a method of the invention for fabricating a magnetometer of the invention.

Figure 11A:
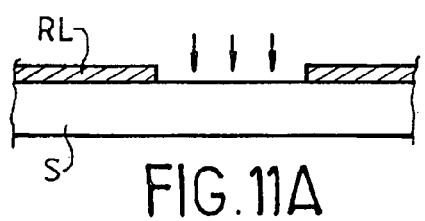
FIG. 11 is a simplified illustration of the various steps in the fabrication of a magnetometer by the method of the invention.
Figure 11B:
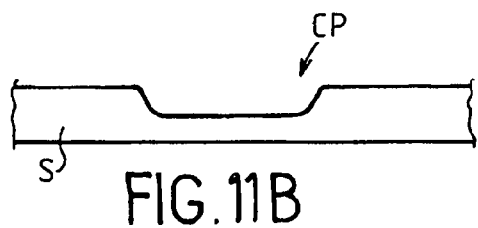

The first step is anisotropic chemical etching of the 100 surface of the silicon, by chemical etching, so as to reveal the denser planes 111 that are inclined at 54.7°. FIG. 11A shows the substrate S covered in a layer of resin RL, with an opening being formed in the resin so as to enable the surface of the substrate to be chemically etched. FIG. 11B shows the cavity CP having the shape of a truncated pyramid that is obtained at the end of the anisotropic etching operation, and after the resin has been eliminated. In a variant, it is possible to obtain projections having the same shape by removing the resin everywhere except in a region of square or rectangular shape. This step is well known in the art, and is described in particular in the above-mentioned article by Chii-Rong Yang et al.

The second step is making the magnetoresistive sensors and connecting them electrically, using conventional deposition and lithographic operations. One difficulty is represented by the fact that lithographic operations require uniform layers of resin to be deposited on the inclined faces of the cavities or the projections. The conventional spin-coating technique is not appropriate since it would leave the slopes uncovered. Nevertheless, there also exist spray-coating techniques or resin evaporation techniques that enable uniform layers of resin to be made even on inclined surfaces. For example reference may be made to the following publications:

Nga P Pham et al. "Spray coating of photoresist for pattern transfer on high topography surfaces", J. Micromech. Microeng. 15 (2005) 691-697;

Vijay Kumar Singh "Deposition of thin and uniform photoresist on three-dimensional structures using fast flow in spray coating" J. Micromech. Microeng. 15 (2005) 2339-2345; and T. Ikehara, R. Maeda "Fabrication of an accurately vertical sidewall for optical switch applications using deep RIE and photoresist spray coating", Microsyst. Technol. 12 (2005) 98-103.

Figure 11C:
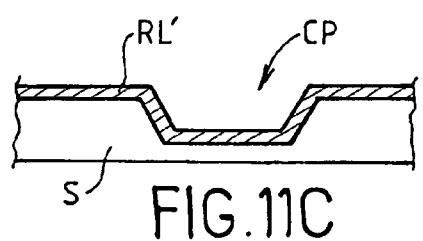

FIG. 11C shows a resin layer RL' deposited by spray coating.

Figure 11D:
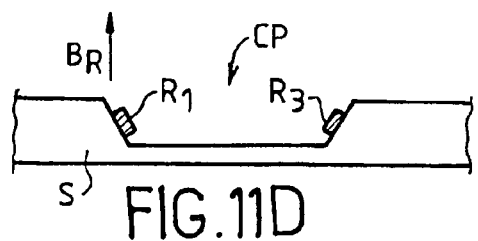

Anneals performed in the presence of an external magnetic field $B_R$ are performed after or during the fabrication of the sensors in order to polarize the blocking layers and the "soft" layers (FIG. 11D).

The invention claimed is:

1. An integrated magnetometer comprising a plurality of multilayer magnetoresistive sensors ($R_1$, $R_2$, $R_3$, $R_4$) deposited on a top surface of a substantially planar substrate (2), wherein:

said top surface of the substrate presents at least one cavity or projection (P, CP) having a plurality of inclined faces;

at least four of said multilayer magnetoresistive sensors are deposited on four of said inclined faces of the at least one cavity or projection, said magnetoresistive sensors presenting four different orientations opposite in pairs, each sensor being sensitive to an external magnetic field component that is parallel to the face on which it is deposited;

said or each cavity or projection presents the shape of a pyramid or a truncated pyramid, having a base which is square or rectangular; and the sensitivity axes ($A_{R1}$, $A_{R2}$, $A_{R3}$, $A_{R4}$) of said sensors are directed towards or away from the tip of said pyramid.

2. An integrated magnetometer according to claim 1, wherein said substrate is of the monocrystalline type, in particular of silicon, said inclined faces corresponding to crystal planes of the substrate.

3. A magnetometer according to claim 1, wherein each of said sensors is constituted by two identical individual sensors, and wherein the individual sensors deposited on faces presenting opposite orientations are connected in a Wheatstone bridge circuit.

4. A magnetometer according to claim 1, wherein said sensors are identical.

5. A magnetometer according to claim 1, wherein said sensors are identical except in that those that are mounted on two opposite faces present sensitivities of opposite signs.

6. A magnetometer according to claim 1, wherein each of said sensors is constituted by four identical individual sensors connected in a Wheatstone bridge, a magnetic shield (BM) being deposited over two of said individual sensors occupying opposite positions in said Wheatstone bridge.

7. A magnetometer according to claim 1, wherein each of said sensors is constituted by two individual sensors (R, R') that are identical except in that they present sensitivities of opposite signs.

8. A magnetometer according to claim 1, wherein said multilayer magnetoresistive sensors are selected from:
giant magnetoresistance sensors; and
tunnel magnetoresistance sensors.

9. A magnetometer according to claim 1, wherein at least one accelerometer (AM) of microelectromechanical type is integrated on said substrate.

10. A magnetometer according to claim 1, exclusively comprising magnetoresistive sensors arranged on said inclined faces.

11. A magnetometer according to claim 1, wherein said magnetoresistive sensors are arranged within a radius that is less than or equal to 1 millimeter, and preferably less than or equal to 100 micrometers.

12. A fabrication method for fabricating a magnetometer comprising a plurality of multilayer magnetoresistive sensors deposited on a top surface of a substantially planar substrate, the magnetometer being characterized in that:

said top surface presents at least one cavity or projection having at least four inclined faces, and at least four of said multilayer magnetoresistive sensors are deposited on four of said inclined faces of the at least one cavity or projection, said magnetoresistive sensors presenting four different orientations opposite in pairs;

the method comprising:

a first step of making said or each cavity or projection in or on said top surface of said substrate;

a second step of making said multilayer magnetoresistive sensors by successive deposition and lithographic operations; and a third step of annealing with an external magnetic field being applied in order to determine the sensitivity axes of the sensors made in this way.

13. A fabrication method according to claim 12, wherein said first step is implemented by anisotropic etching of said substrate, which substrate is monocrystalline.

14. A fabrication method according to claim 12, wherein said second step includes at least one operation of depositing a uniform layer of resin (RL') on the surface of said substrate, the or each deposition operation being performed by spray-coating or vaporizing said resin.

* * * * *